United States Patent [19]

Nguyen

[11] Patent Number: 5,781,718
[45] Date of Patent: Jul. 14, 1998

[54] METHOD FOR GENERATING TEST PATTERN SETS DURING A FUNCTIONAL SIMULATION AND APPARATUS

[75] Inventor: Van Minh Nguyen, Plano, Tex.

[73] Assignee: Texas Instruments Incorporated, Dallas, Tex.

[21] Appl. No.: 293,535

[22] Filed: Aug. 19, 1994

[51] Int. Cl.$^6$ ............................................. G06F 11/00
[52] U.S. Cl. ............................................. 395/183.09
[58] Field of Search ........................ 395/183.09; 364/578, 364/580, 488; 371/22.1, 22.3, 22.4, 22.6, 25.1; 324/73.1; 375/354, 357

[56] References Cited

U.S. PATENT DOCUMENTS

| | | | |
|---|---|---|---|
| 4,519,078 | 5/1985 | Komonytsky | 371/25 |
| 4,998,250 | 3/1991 | Kohlmeier et al. | 371/15.1 |
| 5,005,173 | 4/1991 | Martin | 371/22.6 |
| 5,282,146 | 1/1994 | Aihara et al. | 364/489 |
| 5,291,495 | 3/1994 | Udell, Jr. | 371/22.3 |
| 5,329,471 | 7/1994 | Swoboda et al. | 364/578 |
| 5,341,314 | 8/1994 | Bencivenga et al. | 364/578 |
| 5,390,193 | 2/1995 | Millman et al. | 371/27 |
| 5,475,624 | 12/1995 | West | 364/578 |
| 5,502,661 | 3/1996 | Glunz | 364/578 |
| 5,535,223 | 7/1996 | Horstmann et al. | 371/27 |

*Primary Examiner*—Robert W. Beausoliel, Jr.
*Assistant Examiner*—Stephen C. Elmore
*Attorney, Agent, or Firm*—Carlton H. Hoel; W. James Brady; Richard L. Donaldson

[57] ABSTRACT

A method and apparatus are disclosed for generating modular test pattern sets for production testing of a digital circuit. The method comprises the steps of enabling a pattern generator (16) and executing a functional simulation on a functional simulator (18) until a first time mark. The pattern generator (16) is disabled and the state of the registers in the digital circuit (52) are captured using scanning circuitry in the circuit (52). The captured state is stored in a memory (68) external to the digital circuit (52). The pattern generator (16) is then re-enabled and the registers are reloaded from the memory (68) using the scanning circuitry of the circuit (52). The functional simulation is resumed until a second time mark. Whenever the pattern generator (16) is enabled, a pattern is stored on a storage medium (20) in response to a clock controlling the circuit (52) wherein each pattern represents the electrical state of the inputs and outputs of the circuit (52) during a particular clock cycle.

7 Claims, 5 Drawing Sheets

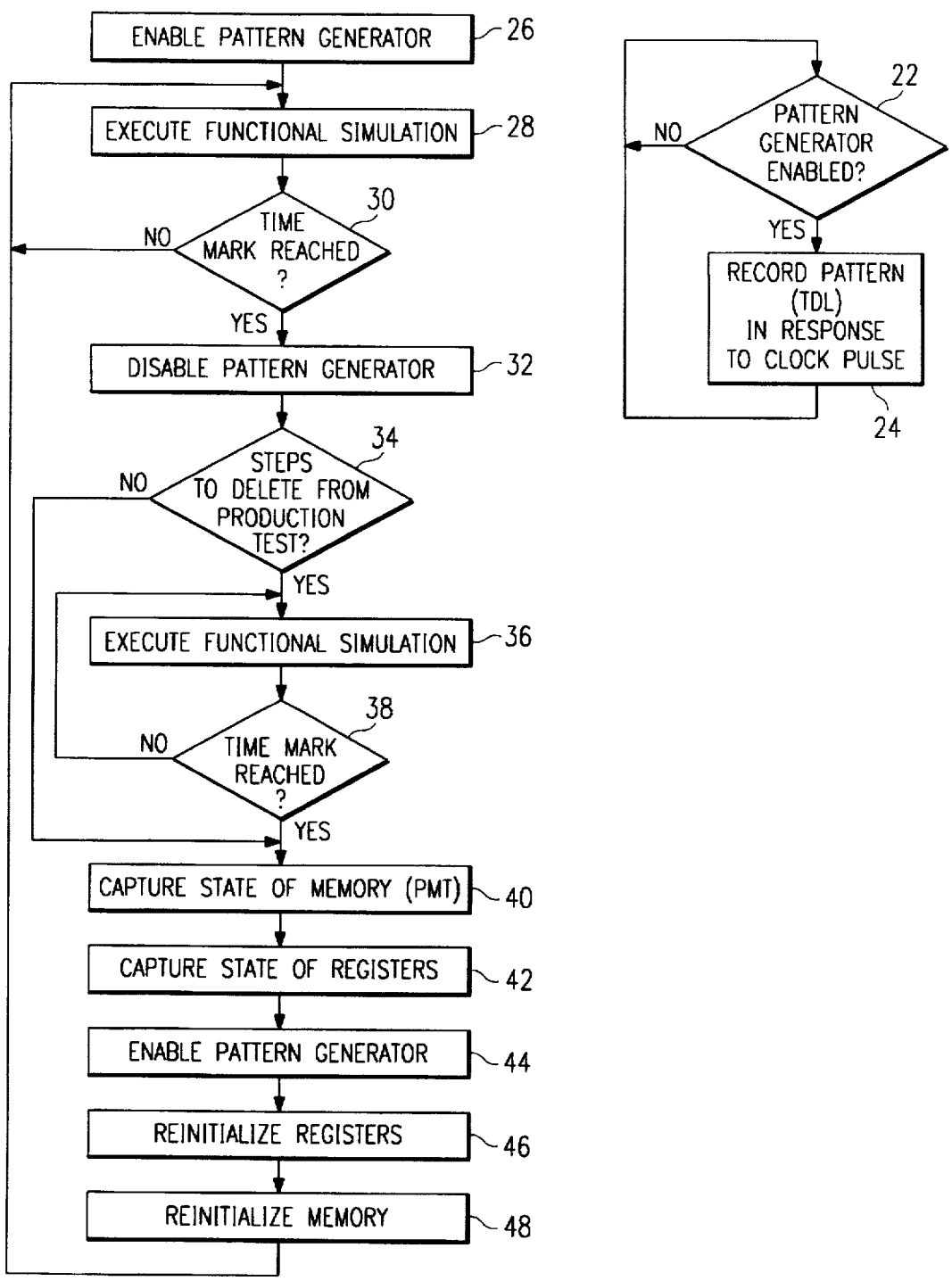

METHOD FOR GENERATING TEST PATTERN SETS DURING A FUNCTIONAL SIMULATION AND APPARATUS

CROSS-REFERENCE TO RELATED APPLICATIONS

This application is related to U.S. application Ser. No. 08/293,762, Attorney's Docket No. TI-18157, filed on Aug. 19 1994 by Van Minh Nguyen and entitled "A Method and Apparatus For Safely Suspending and Resuming Operation Of An Electronic Device", now U.S Pat. No. 5,583,893.

TECHNICAL FIELD OF THE INVENTION

This invention relates generally to electronic systems testing, and more particularly to a method and apparatus for generating test patterns during a functional simulation of an electronic device.

BACKGROUND OF THE INVENTION

Complex electronic circuits are often tested during production to make sure that they function properly. For example, LSI, VLSI, and ULSI integrated circuits are often tested on a tester during production. A typical tester applies electric stimuli to the electronic device and measures the device's response to such stimuli to make sure that the device is functioning properly. To adequately test the various functional blocks in a typical circuit, long test patterns are often designed.

A typical tester uses a test description language (TDL) for testing a circuit. A test description language is a special language used by a tester to drive the circuit being tested with stimuli and check the response of the device to such stimuli. A series of test patterns is known as a pattern set. Each pattern specifies the logic values of the inputs and outputs of a circuit during one clock cycle. Each pattern in a pattern set is applied sequentially to the circuit.

For convenience, pattern sets are often generated during functional simulations. A functional simulator interfaces with a pattern set generator which records the stimuli and responses of the device being simulated. However, the lengths of TDL pattern sets generated during functional simulation become exceedingly long when produced from simulations involving a large amount of data such as digital video data. Current generation testers are limited to approximately 2 to 4 million patterns per pattern set. Functional simulations may easily exceed that limit by more than ten times. Subdividing TDL pattern sets into successive smaller sets and applying them in a specific order is normally not a viable solution during production testing. A device is often simulated during the development process much longer than it is tested during a production test.

Dividing long pattern sets into smaller modules that will fit within the storage capacity of a tester imposes a burden of careful and tedious manual intervention by test personnel during the production test process. First, each module must be executed in a specific order. Second, after each module has finished executing, the clock of the device under test must be stopped synchronously and the next test module must be loaded without disturbing the internal state of the device under test. Often, a module can only be executed after the device has a specific internal state. Because it may take a large number of clock cycles to achieve a specific internal state of the device under test, the order that each module is applied to the device under test is important.

Others have tried to solve the problem of long test pattern sets by designing shorter functional simulations which, in turn, produce shorter pattern sets. Shorter pattern sets, however, may result in tests that are less thorough and may mask potential design and fabrication errors. In addition, a substantial amount of engineering time and effort must be spent devising meaningful short test sequences. If the device requires a large number of patterns to attain a meaningful initial state, it may not be possible to design a short production test, yet thoroughly test the device.

Increasing the capacity of testers is expensive and the storage capacity of a tester has a practical upper limit.

SUMMARY OF THE INVENTION

In accordance with the present invention, a method is provided for generating modular test pattern sets for a digital circuit during the functional simulation of that circuit. An initialization controller for use in performing the method is also disclosed. The method comprises the steps of enabling a pattern generator, executing a functional simulation until a first time mark and disabling a pattern generator. The method further comprises capturing the state of registers in the digital circuit using scanning circuitry in the digital circuit and storing the captured state in a first memory external to the circuit. The pattern generator is re-enabled and the registers are reloaded from the first external memory using the scanning circuitry, and a functional simulation is performed until a second time mark. A pattern is stored on a storage medium in response to a clock that controls the digital circuit while the pattern generator is enabled. The stored pattern represents the electrical state of inputs and outputs of the digital circuit being tested.

One important technical advantage of the present invention is that the size of TDL pattern sets can be optimized for production testing irrespective of the length of the functional simulation of a digital circuit. The invention allows TDL pattern sets to be independently applied in any order because they are self-contained. In other words, because the TDL pattern sets of the current invention initialize the internal state of the device under test at the beginning of a pattern set, long pattern sets need not be executed simply to achieve a meaningful initial state of the device being tested. Production testing can be accelerated because sections of the functional simulation that are computation intensive may be shortened or eliminated from the TDL pattern sets because such sections often yield no new information useful for production testing. The present invention allows the internal state of the digital circuit being tested to be easily inspected or downloaded for debugging purposes during production testing. Furthermore, the present invention can generate pattern sets automatically and transparently to functional simulations. Because the invention allows access to random logic and internal memories of the digital circuit under test, the overall testability of the design is enhanced.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates a flow chart of the various steps of the present method;

DETAILED DESCRIPTION OF THE INVENTION

The present invention and its advantages are best understood by referring to FIGS. 1–9 of the drawings, like numerals being used for like and corresponding parts of the various drawings.

Figure 1:
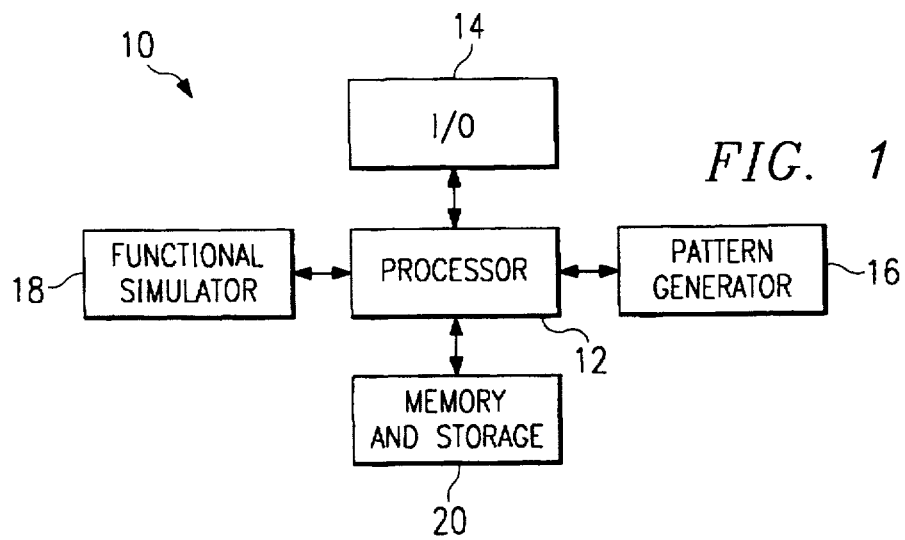
FIG. 1 illustrates a work station capable of performing the method of the present invention.

FIG. 1 illustrates a work station 10 used in carrying out the method of the present invention. Work station 10 comprises processor 12, input/output circuitry 14, pattern generator 16, functional simulator 18 and memory and storage 20. Work station 10 may be, for example, a digital computer.

Functional simulator 18, for example, may be a software program stored in memory and storage 20 and capable of receiving input and producing output through input/output circuitry 14 while running on processor 12. Similarly, pattern generator 16, for example, may be a software program running on processor 12, stored in memory and storage 20 and interacting with a user through input/output circuitry 14. Alternatively, functional simulator 18 and pattern generator 16 can be separate modules of the same software program or the functions of functional simulator 18 and pattern generator 16 may be incorporated into a single software program.

In operation, work station 10 accepts input data through input/output circuitry 14 describing the physical structure of a circuit that a user desires to test (the device under test). The user may also input through input/output circuitry 14 additional data describing the physical structure of additional hardware useful in simulating the device under test. To simulate the operation of the device under test, the user may input data representing physical stimuli to be applied to the device under test. Collectively, this data is known as a simulation program. The data representing the device under test, other hardware, and simulation program may be stored in memory and storage 20. Functional simulator 18 simulates the operation of the device under test and other hardware by applying the simulated physical stimuli of the simulation program.

While functional simulator 18 simulates the device under test, pattern generator 16 records the logic values of the inputs and outputs of the device under test during each clock cycle. The user may selectively control pattern generator 16 through input/output circuitry 14 and/or through functional simulator 18. The user may turn on (enable) the pattern generator during selected portions of the simulation program and turn off (disable) the pattern generator during other portions of the simulation program. The ability to control when pattern generator 16 is enabled and disabled during a functional simulation allows a user to identify specific parts of the simulation program that are most desirable to use for production testing of the device under test. The user may discard unhelpful portions of the simulation in a production test pattern by disabling the pattern generator during such portions. When pattern generator 16 is enabled, it records a pattern for each clock cycle of the device under test and may store each pattern in memory and storage 20. A collection of patterns, known as a pattern set, may then be retrieved by the user through input/output circuitry 14 for use on a production tester.

The present invention allows generation of pattern sets that are self-contained. A pattern set is self-contained if the device under test is initialized at the beginning of the set by a series of patterns. The present invention generates these initialization patterns transparently to the simulation in that the initialization patterns do not leave any residual side effects that disturb the state of the device under test. The present invention generates initialization patterns transparently to the functional simulator 18.

The following provides a brief overview of the present invention. The simulation program runs for a number of clocks with pattern generator 16 enabled. Functional simulator 18 then suspends operation of the device under test and stops the device's clock. Pattern generator 16 is turned off and the internal state of the device under test is captured using an initialization controller. Pattern generator 16 is re-enabled and the internal state of the device under test is reloaded from the initialization controller under control of the simulation program. The simulation program then continues to simulate the device under test for a number of clocks and the above steps can be repeated.

The present invention may be used where the operation of the device under test may be safely suspended by stopping its clock or clocks. The registers of the device under test, with the exception of the clock divider, should normally be capable of being read out (captured) by external circuitry by using a device's internal scanning circuitry. If the device under test has internal memory, the internal memory should also be accessible by external circuitry. One method used to access the internal memory of a digital device is parallel module testing, which is disclosed in U.S. Pat. No. 5,005, 173, issued to Martin and assigned to Texas Instruments Inc., which is incorporated herein by reference.

FIG. 2 illustrates the steps in the method of the present invention. During a functional simulation, the pattern generator may record a pattern in response to each clock pulse of the device under test while the pattern generator is enabled. The term, "clock pulse" may refer to each pulse of a clock signal being input to the device under test or to a clock pulse of a clock signal output by the device under test which may comprise a divided down version of a clock signal input to the device under test. At step 22, a determination is made about whether or not pattern generator 16 is enabled. If pattern generator 16 is not enabled, flow proceeds back to step 22. If pattern generator 16 is enabled, a pattern is recorded in response to each clock pulse of the device under test as illustrated at step 24. This process may continue for each clock pulse of the device under test.

The pattern generator is enabled at step 26. The device under test may then be simulated until a specific time mark while patterns are generated. For example, the design could be simulated by functional simulator 18 for 100,000 clock cycles while patterns are being generated. This process is illustrated by steps 28 and 30. At step 28, functional simulator 18 executes a step of the simulation representing one clock pulse of the device under test. At step 30, functional simulator 18 determines whether a time mark has been reached. If a time mark has been reached, flow proceeds to step 32. If a time mark has not been reached, the functional simulator executes another step in the simulation by returning to step 28.

After a time mark has been reached, the pattern generator is disabled in step 32. At this point, the user may cause various steps in the functional simulation to be deleted from a production test pattern set. Certain steps in the functional simulation may yield no useful information when performed during a production test. The user may desire to delete these steps from the production test altogether. If the user desires to delete functional simulation steps from the production test, the functional simulation may be continued until another time mark. This process is illustrated in FIG. 2 by steps 34, 36 and 38. At step 34, a decision is made about whether or not steps are to be deleted from the production test pattern set. If not, flow proceeds to step 40; if so, flow proceeds to step 36 where an additional simulation step is simulated. After an additional step has been simulated, flow proceeds to step 38 where it is determined if another time mark has been reached. If another time mark has been reached, flow proceeds to step 40. If a time mark has not been reached, simulation continues by returning to step 36. In this way, the functional simulator may execute a number of simulation steps with the pattern generator disabled. Because the pattern generator is disabled during these steps, it does not record a pattern for these steps.

To accomplish the goal of generating modular pattern sets, the pattern set will normally begin with patterns that initialize the internal state of the device under test. The present invention automatically generates these patterns for the beginning of a pattern set using the scanning circuitry of the device under test while it is being simulated by the functional simulator. The steps used to generate the initialization patterns are steps 40 through 48 illustrated in FIG. 2.

Often, a device passes through a large number of clock cycles before it arrives at a given internal state. The present invention avoids the need for the device under test to have stimuli applied for a large number of clock cycles during production testing merely to arrive at the desired internal state to begin a meaningful test of the device. Because the production tester can initialize the internal state of the device under test at the beginning of a pattern set, the need to apply a large number of stimuli to achieve this internal state is eliminated. The present invention also eliminates the need for the designer of the device under test to determine what the initial internal state of the device should be for a given pattern set. Instead, the present invention automatically generates initialization patterns at the beginning of a pattern set.

At step 40, the contents of the memory of the device under test are sequentially read out and temporarily stored. Prior to reading out the contents of memory, the clock or clocks for the device under test and for other hardware being simulated are stopped. The contents of memory, for example, may be read out using parallel module testing techniques. After the contents of memory have been read out, the contents of the registers of the device under test are scanned out and temporarily stored in step 42 using scanning circuitry in the device under test. At step 44, the pattern generator is re-enabled. The flow then proceeds to step 46 where the registers of the device under test are re-initialized using the contents that were scanned out and temporarily stored at step 42. At step 48, the memory in the device under test is re-initialized using the contents that were read out and temporarily stored in step 40. After memory has been re-initialized in step 48, all clocks are re-enabled so that simulation may resume. The flow then proceeds to step 28 where the functional simulation continues until the next time mark and the process repeats itself.

Each sequence, beginning at step 44 when the pattern generator is enabled, and ending at step 32 when the pattern generator is disabled produces a self-contained pattern set. These steps (44 through 32) can be repeated many times throughout the functional simulation to generate a number of self-contained pattern sets.

If the device under test does not have internal memory, steps 40 and 48 could be omitted. As illustrated, the contents of memory are read out in step 40 before the registers are scanned out in step 42. In some digital devices having scanning circuitry and parallel module testing circuitry, the shifting that occurs during the scanning of the registers can trigger false write pulses which can affect the contents of the memory of the device under test. If the device under test is designed such that scanning out of the registers does not affect the contents of memory, then the order of steps 40 and 42 could be interchanged.

It should be noted that the clock of the device under test should be synchronously turned off and on. Many digital circuits have clock dividers that are not scannable because the clock is used during the scanning operation. To avoid state inconsistencies between the devices in the system and to avoid affecting the internal state of the device under test, the clock of the device under test should be stopped and restarted in the proper state. One method and apparatus for properly controlling the clock for the device under test is described below in connection with FIGS. 5–9. Clock synchronization may be made simpler if the device under test allows bypass of its internal clock dividers. A pin could be used to select external clocks to directly drive the internal logic.

The system being simulated may include asynchronous elements such as random access memories. Control signals for these elements can be gated appropriately to prevent state inconsistencies. Alternatively, these devices may be modeled as sequential logic. When clocks are inactive, the operation of dynamic RAMS will be frozen. Although actual dynamic RAMS would lose their state, a functional simulator can be programmed to allow their state to be preserved when its operation is frozen. Rather than putting time marks in the functional simulation program, the device under test could provide signals reflecting its internal state which could be used dynamically to control the pattern generator.

The method of the present invention employs a mechanism to coordinate all of the previously described steps. Detailed operations are device dependent because of the specific features of the device under test. One possible implementation technique is a control script written in the simulation control language provided by the simulator. Another possible approach is hardware external to the design and part of the system to be simulated. The hardware approach is desirable because it is independent of the simulator, easier to be modified to accommodate different designs, and transparent because it does not interfere with the simulation. An initialization controller implementing the hardware approach is described below.

Figure 3:
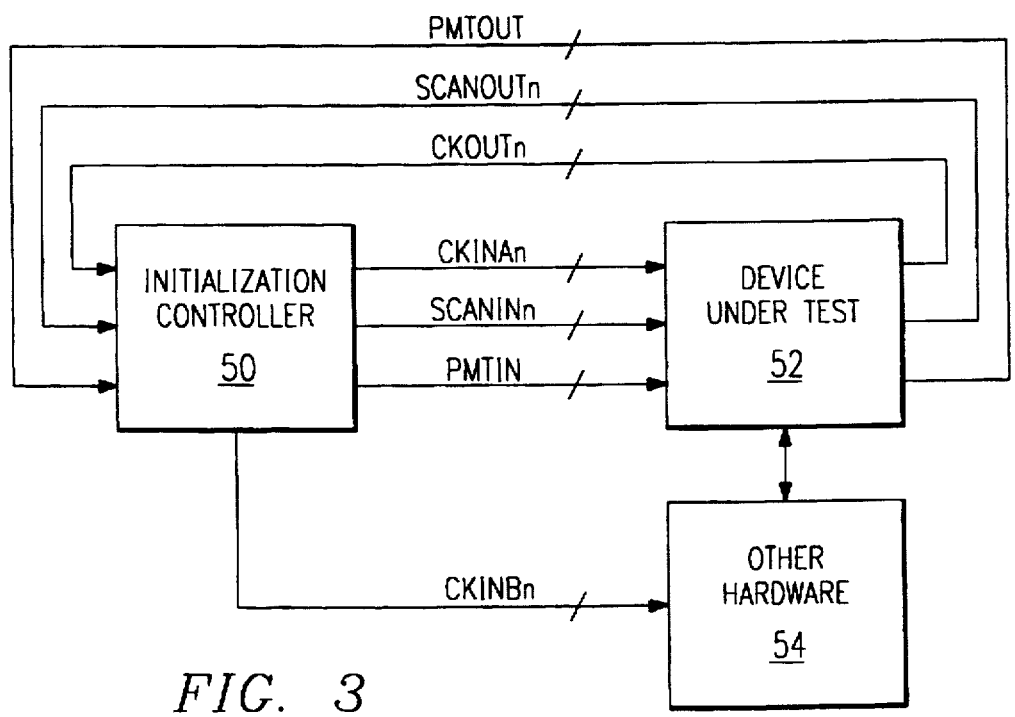
FIG. 3 illustrates how the initialization controller of the present invention interfaces with a device under test and other hardware during a functional simulation of the device under test.

The present method has many advantages. Modular pattern sets for production testing can be easily generated and their sizes can be optimized for a specific tester irrespective of the length of a functional simulation test. Because each pattern set is self-contained, it can be applied irrespective of when other pattern sets are applied. Production tests can be made substantially shorter than the functional simulation tests, thus reducing the time that it takes to test a device and also lowering the cost of production. This method also allows the internal state of the device to be easily inspected or downloaded for de-bugging purposes during functional simulation. The process of generating modular pattern sets can be made automatic and transparent to the functional simulation. Because access to random logic and the internal memories of the device under test is provided, the overall testability of the design is enhanced FIG. 3 illustrates initialization controller 50 constructed in accordance with the teachings of the present invention and interfaced with device under test 52 and other hardware 54. Device under test 52 is equipped with both scanning circuitry and parallel module test circuitry (not explicitly shown) to allow capture of its internal state.

Device under test 52 is controlled by one or more clock signals denoted by the symbol CKINAn in FIG. 3. Device under test 52 also produces one or more clock signals denoted with the symbol CKOUTn in FIG. 3. Initialization controller 50 generates the clock inputs to the device under test as well as one or more clock signals, CKINBn, provided to other hardware 54.

Initialization controller 50 monitors clock output signals CKOUTn and may deactivate one or more clock signals, CKINAn and/or CKINBn, synchronously in response to clock signals CKOUTn. During scan operations, signals CKINAn are activated while signals CKINBn are disabled to prevent state inconsistencies between device under test 52 and other hardware 54. When normal simulation resumes, signals CKINAn and CKINBn are reactivated synchronously.

After all clocks have been disabled, the initialization controller 50 initiates a parallel module test protocol to enter the parallel module test mode. Subsequently, all contents of the internal memory of device under test 52 are sequentially read out into the initialization controller and stored in a memory that could be contained in initialization controller 50. Each RAM internal to the device under test can, for example, have an equivalent peer in initialization controller 50. Having an equivalent peer simplifies address generation because the read addresses for device under test 52 and the write addresses for initialization controller 50 can be the same. Parallel module testing is accomplished used the parallel module test inputs and outputs of the device under test. The parallel module test inputs for the device under test in FIG. 3 are labeled PMTIN while the parallel module test outputs are labeled PMTOUT.

The design of initialization controller 50 may depend upon whether scan chains of device under test 52 may be individually enabled or have equal length. A scan chain refers to a chain of shift register elements used to access the internal state of a device's registers. For generality, the device under test could have many scan chains of different lengths and could be driven by clocks of different frequencies. The discussion below provides a discussion of three possible cases that may exist for scanning the internal state of device under test 52 with varying scan chain lengths and varying lengths of scan chains associated with a given clock. As illustrated in FIG. 3, device under test 52 has one or more scan inputs SCANINn and one or more scan outputs SCANOUTn.

If a given clock input for device under test 52 is associated with only one scan chain, then each clock may clock the appropriate scan chain for the appropriate number of clock cycles. For example, CKINA1 may clock SCANOUT1 for a number of clock cycles, L1, equivalent to the length of the scan chain. Similarly, when the first scan chain is loaded, CKINA1 could cause data to be scanned in through input SCANIN1 for L1 clock cycles.

A second case where a clock is associated with multiple scan chains of unequal but comparable lengths presents a few additional difficulties. For example, suppose that CKINA2 is used to clock scan chains 2 and 3, of lengths L2 and L3, respectively, where L2>L3 but L2≈L3. To scan in or scan out the contents of scan chains 2 and 3, CKINA2 is activated for L2 clocks. To correctly circulate the shorter chain, scan chain 3, a virtual register of length L2–L3 is connected at SCANOUT 3, effectively lengthening scan chain 3. The result is that both chains 2 and 3 now have the same length and hence will recirculate data correctly after L2 clocks. This concept can be extended to multiple scan chains of different lengths. Virtual registers are actually implemented as one bit wide RAMS. This implementation is advantageous in most simulators because it ordinarily requires less primitives than direct use of registers. The speeds of incremental compilation and simulation are inversely proportional to the size of the database in most simulators. If a clock is associated with multiple scan chains having the same length, the clock may be used to clock the appropriate scan chains for that number of clock cycles.

In a third case, a clock is associated with multiple scan chains having disparate lengths and a different configuration might be used. For example, suppose that CKINA2 clocks scan chains 2 and 3 of lengths L2 and L3 respectively where L2≧L3. Let n be the number of the clock cycle being applied to the scan chains at a given time. While n≦L3, SCANOUT3 is temporarily stored into a one bit wide RAM. When L3<n≦L2, the RAM'S contents are shifted out onto SCANIN3 in a first in, first out manner. When n=L2, both scan chains have recirculated their original data. A similar approach can be applied with a larger number of scan chains.

Figure 4:
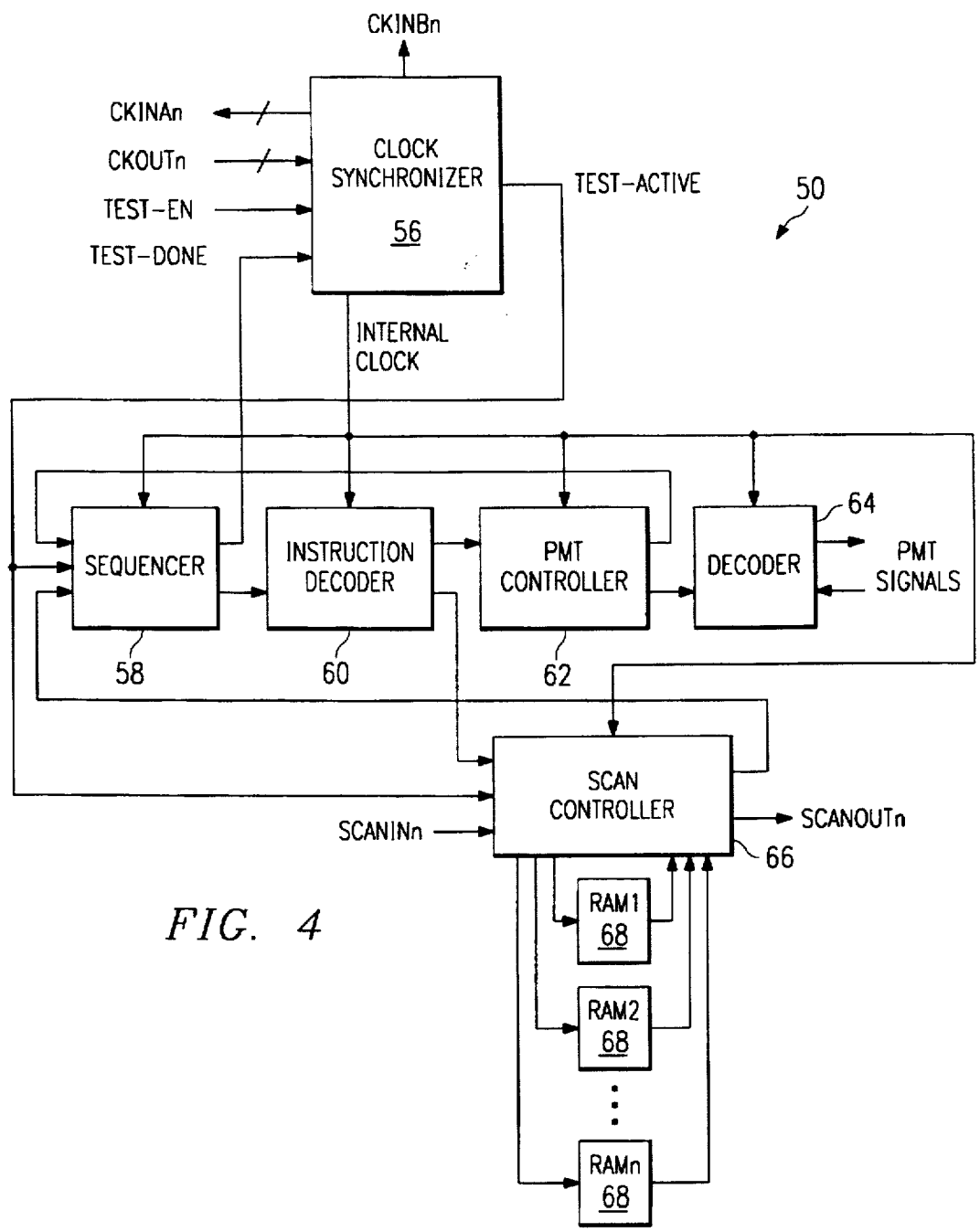
FIG. 4 illustrates a block diagram of an initialization controller made in accordance with the teachings of the present invention.

The operation of initialization controller 50 can be more easily understood in connection with FIG. 4. FIG. 4 illustrates one embodiment of initialization controller 50 constructed in accordance with the teachings of the present invention. Other embodiments of initialization controller 50 could be constructed without departing from the teachings of the present invention. Initialization controller 50 comprises clock synchronizer 56 which may be connected to sequencer 58 and scan controller 66. Sequencer 58 also may be connected to instruction decoder 60 and PMT controller 62 and scan controller 66. Instruction decoder 60 may be connected to PMT controller 62 and scan controller 66. PMT controller 62 may be connected to decoder 64. Scan controller 66 may be connected to a plurality of RAMS 68.

Clock synchronizer 56 generates all system clocks. Clock synchronizer 56 also monitors the clock outputs of the device under test so that clocks may be stopped and restarted synchronously. TEST-EN is an input signal received by clock synchronizer 56 from an external source that indicates a request for initialization controller 50 to enable the test mode for the device under test. Clock synchronizer 56 can be, for example, the clock synchronizer circuit described in connection with FIGS. 5–9.

Sequencer 58 can be a hard-coded sequencer that schedules the sequence of operations for initialization controller 50. Sequencer 58 may include a series of operations for reading all RAMS of the device under test, scanning out all registers of the device under test, restoring the contents of the registers to the device under test, and reloading the memory of the device under test. Sequence 58 may also control the order in which the RAMS are accessed. Sequencer 58 could also be, for example, programmable. Sequencer 58 generates a TEST-DONE signal that indicates to clock synchronizer 56 that the test mode is done and that the clock signals for the device under test may be restarted for normal operations.

Instruction decoder 60 decodes instructions from the sequencer and provides control signals to PMT controller 62 and scan controller 66. PTM controller 62 generates parallel module test control signals in accordance with the teachings of U.S. Pat. No. 5,005,173. Decoder 64 decodes the PMT control signals and interfaces with the test inputs and outputs of the modules residing in the device under test. PMT controller 62 can also include RAM for storing the contents of the memory of the device under test. PMT controller 62 is operable to signal sequencer 58 to indicate when a parallel module test sequence has been completed.

Scan controller 66 is connected to the scan inputs and scan outputs of the device under test. Scan controller 66 receives control signals from instruction decoder 60 and reads the state of the registers of the device under test from the scan output of the device under test and stores the state of those registers in RAM 68. RAM 68 serves as a buffer memory. Scan operations for scan controller 66 are controlled by clock signals generated by clock synchronizer 56.

In operation, clock synchronizer 56 generates one or more clock signals, CKINAn, for the device under test. Clock synchronizer 56 monitors one or more clock signals, CKOUTn, generated by the device under test in response to the input clock signals CKINAn. Other hardware 54 is clocked by clock signals CKINBn, generated by clock synchronizer 56. Clock synchronizer 56 monitors signal CKOUTn so that it may synchronize an internal clock signal to ones of clock outputs CKOUTn. When an initialization controller 50 receives a signal indicating that the internal state of the device under test is to be scanned and then restored, clock synchronizer 56 synchronously stops the clock inputs, CKINAn, in response to one or more clock signals, CKOUTn. Clock synchronizer 56 also stops clock signal CKINBn in synchronization with one or more clock signals, CKOUTn.

After the clocks have been safely stopped, clock synchronizer 56 generates a test active signal that indicates that the clock inputs, CKINAn, to the device under test have been safely stopped. This signal is synchronized with the internal clock signal. The internal clock signal is synchronized with one or more of the clock output signals from the device under test, CKOUTn. The internal clock signal continues to run in the absence of the clock outputs CKOUTn and may be used by clock synchronizer 56 to guarantee that the clock inputs to the device under test, CKINAn are enabled and disabled synchronously in the proper state.

After sequencer 58 receives the test active signal indicating that it should begin its sequence, it generates the sequence of operation commands that are decoded by instruction decoder 60. PMT controller 62 then causes the state of the memory of the device under test to be read out and stored in a buffer memory (not explicitly shown) coupled to PMT controller 62. Alternatively, RAM 68 could be used to store the state of the internal memory of the device under test. After all of the internal memory of the device under test has been stored, PMT controller 62 may signal sequencer 58 to indicate the completion of this step. Sequencer 58, through instruction decoder 60, next causes scan controller 66 to scan in the contents of the registers of the device under test and store the register state in RAMS 68, which serve as a buffer memory. Scan controller 66 may also indicate to sequencer 58 when scanning is completed.

After the registers have been scanned under control of scan controller 66, sequencer 58 causes scan controller 66 to restore the contents of the registers of the device under test and then causes PMT controller 62 to restore the contents of the internal memory of the device under test. After these operations are complete, sequencer 58 signals clock synchronizer 56 that operations are complete. Clock synchronizer 56 synchronously removes any control signals related to scanning from the device under test and may also synchronously restart the clock signals CKINAn and CKINBn. Initialization controller 50 may also receive and generate hand shaking signals (not explicitly shown) for accomplishing the start and finish of the scanning process.

Figure 5:
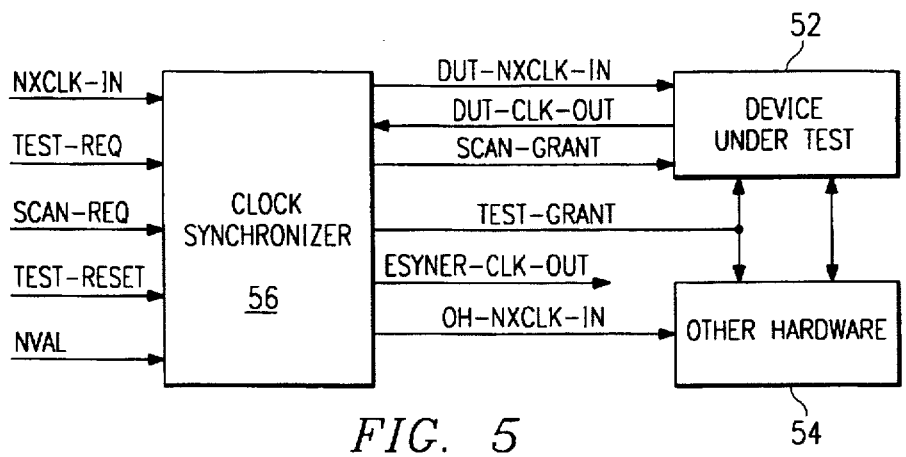
FIGS. 5 illustrates an embodiment of a clock synchronizer interfaced with a device under test and other hardware that can be used in the initialization controller of the present invention.

FIG. 5 illustrates a clock synchronizer 56 constructed in accordance with the teachings of the present invention. Clock synchronizer 56 interfaces with a device under test 52 and other hardware 54. Device under test 52, for example, can be a microprocessor, microcontroller, video processor, ASIC, etc. The operation of clock synchronizer 56 will be more fully described below but the following discussion gives a brief overview of the theory of its operation.

NXCLK-IN is a clock signal received as an input to clock synchronizer 56. Clock synchronizer 56 divides this signal down by modulo N to generate other clocks. The term, modulo, refers to the value of the divisor of the clock divider. For example, a divide by 3 counter has a modulo of 3. NVAL is an input signal representing the value N, by which the device under test 52 divides its input clock signal. DUT-NXCLK-IN is a clock input signal to device under test 52 which is further divided modulo N to generate other clocks. DUT-CLK-OUT is a clock signal output by device under test 52 that comprises the signal DUT-NXCLK-IN divided modulo N. OH-NXCLK-IN is a clock signal generated by clock synchronizer 56 and used as a clock for other hardware 54. ESYNER-CLK-OUT is a clock signal generated by clock synchronizer 56 that is synchronized to DUT-CLK-OUT while DUT-NXCLK-IN is enabled. When signal DUT-NXCLK-IN is disabled, signal ESYNER-CLK-OUT keeps track of the proper state of the internal clock divider of device under test 52.

TEST-REQ is an asynchronous input signal to clock synchronizer 56 that indicates a request to suspend normal operation of DUT-NXCLK-IN. TEST-GRANT is a synchronous output indicating that DUT-NXCLK-IN has been safely stopped. TEST-GRANT may be synchronized to ESYNER-CLK-OUT and NXCLK-IN. TEST-RESET is an input signal that resets clock synchronizer 56 upon power up.

SCAN-REQ is an asynchronous input to clock synchronizer 56 requesting resumption of DUT-NXCLK-IN so that a scan operation may be performed on device under test 52. SCAN-GRANT is an output produced by clock synchronizer 52 indicating that a scan operation may proceed. SCAN-GRANT may be synchronized to ESYNER-CLK-OUT and NXCLK-IN.

Clock synchronizer 56 generates signal DUT-NXCLK-IN from signal NXCLK-IN. The state of the clock divider in device under test 52 will be random at power up. Clock synchronizer 56 synchronizes to the state of the internal clock divider of device under test 52 using DUT-CLK-OUT. Once synchronization is established, the state of the internal clock divider of device under test 52 is deterministic and predictable. Clock synchronizer 56 can thus determine what state the internal clock divider of device under test 52 was in when DUT-NXCLK-IN is disabled. Clock synchronizer 56 may then re-enable DUT-NXCLK-IN at the proper time. Because clock synchronizer 56 keeps ESYNER-CLK-OUT running continuously even when DUT-NXCLK-IN is disabled, signals needed to control device under test 52 can be properly synchronized even when its input clock is disabled. Clock synchronizer 56 can disable DUT-NXCLK-IN when the internal clock divider of device under test 52 is in a predetermined state, and re-enable DUT-NXCLK-IN so that the divider proceeds to the next state following the predetermined state when DUT-NXCLK-IN is re-enabled.

In summary, clock synchronizer 56 mirrors the operation of the internal clock divider of device under test 52 by synchronizing with DUT-CLK-OUT. Because clock synchronizer 56 can mirror the internal clock divider of device under test 52, the input clock to device under test 52 can be disabled and re-enabled in a manner that avoids device malfunctions.

Figure 6:
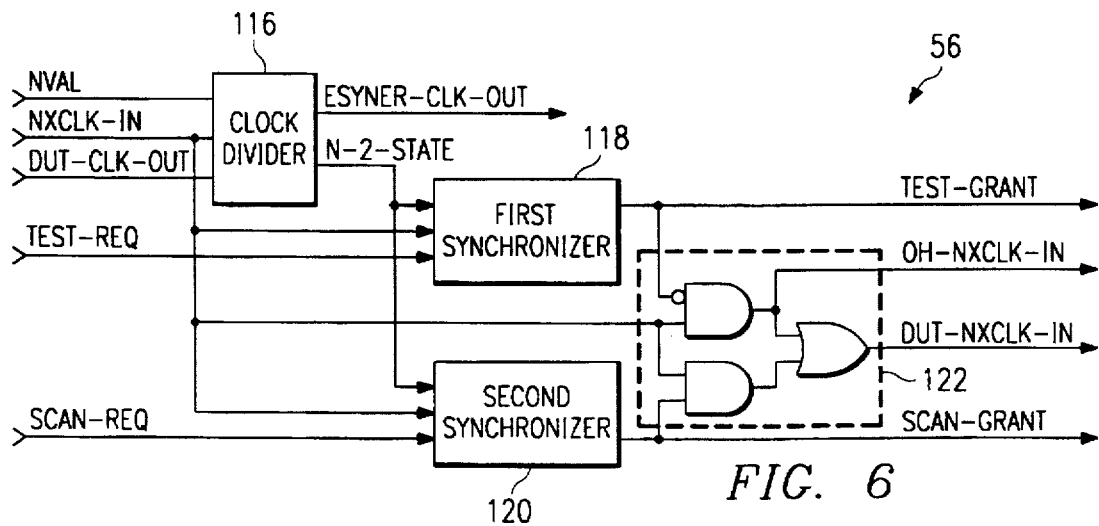
FIG. 6 illustrates a block diagram of an embodiment of a clock synchronizer that can be used in the initialization controller of FIG. 4.

FIG. 6 illustrates an embodiment of clock synchronizer 56 constructed in accordance with the teachings of the present invention. Clock synchronizer 56 comprises clock divider 116, first synchronizer 118, second synchronizer 120 and clock logic circuit 122. Clock divider 116 couples to first synchronizer 118, second synchronizer 120 and clock logic circuit 122. First synchronizer 118 and second synchronizer 120 also couple to clock logic circuit 122.

Clock divider 116 is operable to receive NXCLK-IN and DUT-CLK-OUT and generate ESYNER-CLK-OUT. ESYNER-CLK-OUT comprises NXCLK-IN divided by a divide factor. When DUT-CLK-OUT is disabled, ESYNER-CLK-OUT continues to operate as DUT-CLK-OUT would have operated had it not been disabled. Clock divider 116 is further operable to generate a state signal indicating that ESYNER-CLK-OUT is currently in a predetermined one of a plurality of states. In the embodiment illustrated in FIG. 6, N-2-STATE indicates when ESYNER-CLK-OUT is in state N-2 where N refers to the modulo of the internal clock divider of device under test 52. Because clock synchronizer 56 can be used with electronic devices having varying size clock dividers, the modulo is an input to clock divider 116 and is represented by N. The operation of clock divider 116 will be more fully described in connection with FIG. 7 below.

First synchronizer 118 is operable to generate a test grant signal, TEST-GRANT, in response to an externally generated test request signal—TEST-REQ, the first state signal—N-2-STATE, generated by clock divider 116 and clock signal—NXCLK-IN. TEST-GRANT has an on-state and an off-state, and first synchronizer 118 causes TEST-GRANT to make a transition between the off-state and the on-state during a predetermined state of ESYNER-CLK-OUT. In the embodiment illustrated in FIG. 6, first synchronizer 118 causes a transition to occur when ESYNER-CLK-OUT is in state N-2. The operation of first synchronizer 118 will be more fully described in connection with FIG. 7 below.

Similarly, second synchronizer 118 is operable to generate a scan grant signal—SCAN-GRANT, in response to a scan request signal—SCAN-REQ, the first state signal—N-2-STATE, and clock signal—NXCLK-IN. SCAN-GRANT also has an on-state and an off-state. Second synchronizer 120 is further operable to cause SCAN-GRANT to make a transition between its on-state and off-state only during a predetermined state of ESYNER-CLK-OUT. In the embodiment illustrated in FIG. 6, second synchronizer 120 causes a transition during state N-2 in response to signal N-2-STATE from clock divider 116.

Clock logic circuit 122 controls the generation of OH-NXCLK-IN and DUT-NXCLK-IN, enabling and disabling these signals at the proper time. DUT-NXCLK-IN is equivalent to NXCLK-IN when DUT-NXCLK-IN is enabled. Clock logic circuit 122 is operable to enable and disable DUT-NXCLK-IN in response to TEST-GRANT and SCAN-GRANT. TEST-GRANT indicates DUT-NXCLK-IN should be disabled to enter test mode. Accordingly, once a test request is received, DUT-NXCLK-IN is disabled in response to the synchronously generated TEST-GRANT signal. Once TEST-GRANT is asserted (in its on-state), indicating that DUT-NXCLK-IN has been stopped, a scan may safely be initiated. Once TEST-GRANT is asserted (in its on-state), a scan request may be generated. In response to the scan request, clock logic circuit 122 re-enables DUT-NXCLK-IN in response to the SCAN-GRANT signal. Once SCAN-GRANT is asserted (in an on-state), DUT-NXCLK-IN may be safely restarted. Because SCAN-GRANT is synchronized to occur when ESYNER-CLK-OUT is in the predetermined state, DUT-NXCLK-IN is re-enabled in the proper state.

Similarly, when the scanning operation is finished, SCAN-GRANT may make the transition from its on-state to its off-state during the predetermined state of ESYNER-CLK-OUT, allowing DUT-NXCLK-IN to be disabled in the predetermined state. In the embodiment illustrated in FIG. 6, DUT-NXCLK-IN is disabled when its clock divider is in state N-2. Once SCAN-GRANT has made a transition from its on-state to its off-state, the test request signal may be removed, indicating that clock synchronizer 56 should re-enable DUT-NXCLK-IN. Clock logic circuit 122 re-enables DUT-NXCLK-IN in the state following the predetermined state after TEST-GRANT makes a transition from its on-state to its off-state during the predetermined state. In the embodiment illustrated in FIG. 6, DUT-NXCLK-IN is re-enabled in state N-1.

Because other hardware interacting with the device under test is normally not re-enabled during a scan operation, OH-NXCLK-IN is disabled during the entire sequence above. OH-NXCLK-IN is disabled after TEST-GRANT is asserted (makes a transition from its off-state to its on-state). Because TEST-GRANT is synchronized, OH-NXCLK-IN also is disabled during a predetermined state and re-enabled in the state following the predetermined state. In the embodiment illustrated in FIG. 6, OH-NXCLK-IN is disabled during state N-2 and re-enabled in state N-1.

Figure 7:
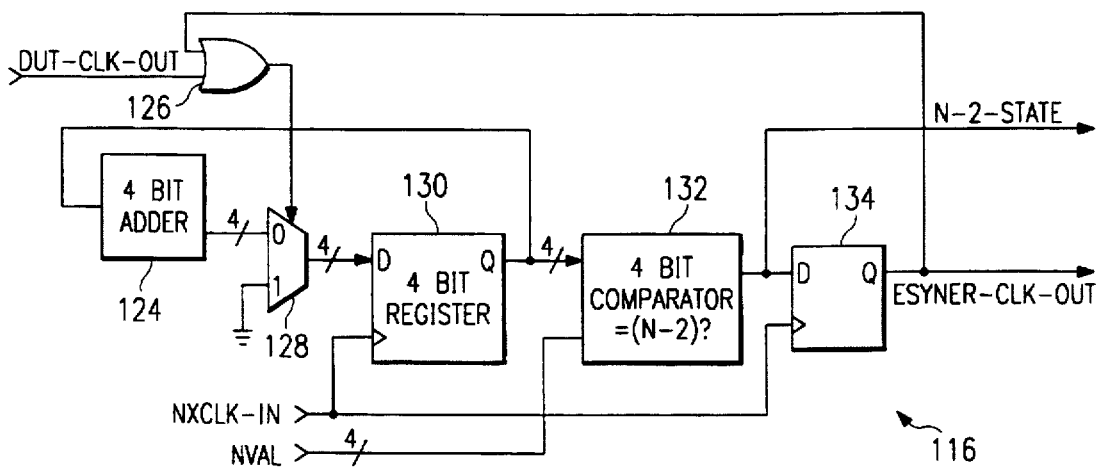
FIG. 7 illustrates an embodiment of a clock divider that can be used in the clock synchronizer circuit of FIG. 6.

FIG. 7 illustrates an embodiment of clock divider 116 constructed in accordance with the teachings of the present invention. Clock divider 116 comprises adder 124, OR-gate 126, multiplexer 128, register 130, comparator 132, and flip-flop 134. Adder 124 couples to multiplexer 128 and register 130. In this embodiment, adder 124 is an incrementer. Because adder 24 is an incrementer, it has only one input shown. The other input (not explicitly shown) may be hard wired to add one to the illustrated input. Multiplexer 128 also couples to register 130 and OR-gate 126. OR-gate 126 also couples to flip-flop 134. Register 130 couples to comparator 132 while comparator 132 couples to flip-flop 134.

Clock divider 116 is programmable in that the modulo of the internal clock divider of the device under test, N, can be input to comparator 132 using the inputs, NVAL. Comparator 132 controls the modulo of clock divider 116. In the embodiment illustrated in FIG. 7, adder 124, multiplexer 128, register 130, and comparator 132 are all four bit components. However, components having a different number of bits could be used without departing from the scope and teachings of the present invention.

In the embodiment illustrated in FIG. 7, DUT-CLK-OUT passes through N states, 0 through N−1. DUT-CLK-OUT has a high value during state N−1 and a low value during all other states. After power up, clock divider 116 synchronizes ESYNER-CLK-OUT to DUT-CLK-OUT. As soon as DUT-CLK-OUT enters state N−1, it causes multiplexer 128 to present inputs equivalent to state 0 to appear at register 130. Upon the next transition of NXCLK-IN, state 0 is loaded into register 130. For N≠2, comparator 132 will produce a low output as will ESYNER-CLK-OUT upon the next positive transition of NXCLK-IN. Register 130 continues to increase by one each clock cycle as adder 124 increments the output of register 130 by one. Multiplexer 128 passes the output of adder 124 to register 130 because DUT-CLK-OUT remains low until state N−1. Once register 130 has reached state N−2, comparator 132 produces a high output. Upon the next positive transition of NXCLK-IN, ESYNER-CLK-OUT will be high. ESYNER-CLK-OUT is now synchronized to DUT-CLK-OUT. Clock divider 116 of FIG. 7 may properly synchronize ESYNER-CLK-OUT to DUT-CLK-OUT after a few transitions of NXCLK-IN upon power up.

Once ESYNER-CLK-OUT is properly synchronized to DUT-CLK-OUT, clock divider 116 will continue to produce ESYNER-CLK-OUT even when DUT-CLK-OUT is disabled. Because ESYNER-CLK-OUT is fed back through OR-gate 126 to control multiplexer 128, ESYNER-CLK-OUT will itself cause a transition to state 0 from state N−1 when ESYNER-CLK-OUT is in state N−1. DUT-CLK-OUT is only received to initially synchronize ESYNER-CLK-OUT to the internal clock divider of the device under test.

Figure 8:
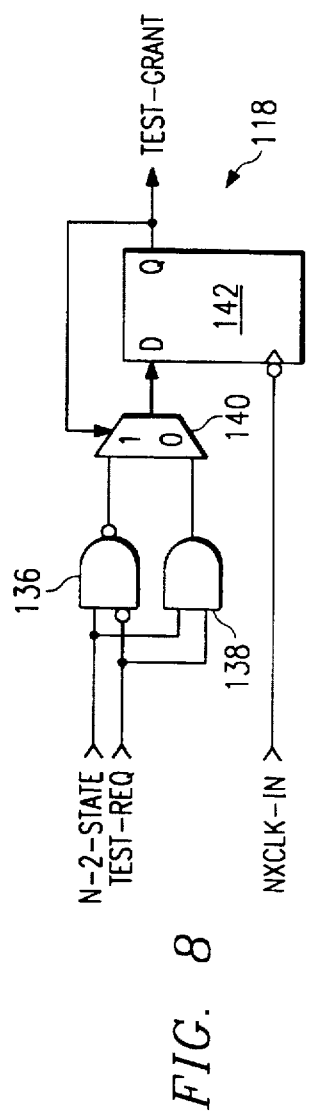
FIG. 8 illustrates an embodiment of a synchronizer that can be used in the clock synchronizer circuit of FIG. 6.

FIG. 8 illustrates an embodiment of first synchronizer 118 constructed in accordance with the teachings of the present invention. The embodiment illustrated in FIG. 8 may also be used for second synchronizer 120. First synchronizer 118 comprises AND-gate 136, AND-gate 138, multiplexer 140, and flip-flop 142. AND-gate 136 couples to multiplexer 140. AND-gate 138 couples to multiplexer 140. Multiplexer 140 couples to flip-flop 142 and is controlled by the output of flip-flop 142.

The operation of first synchronizer 118 is as follows. Initially, TEST-GRANT is in an off-state (low). When an asynchronously generated test request, TEST-REQ, is received, first synchronizer 118 waits until clock signal ESYNER-CLK-OUT is in state N−2 by receiving signal N−2-STATE from clock divider 116 (not explicitly shown). Once ESYNER-CLK-OUT is in state N−2, the output of AND-gate 138 goes high, causing the input to flip-flop 142 to be high. Upon the next transition from high to low of NXCLK-IN, TEST-GRANT goes high. Because TEST-GRANT is now high, input 1 of multiplexer 140 appears on the output of multiplexer 140. Accordingly, the output of AND-gate 136 now controls the input to flip-flop 142. AND-gate 136 will continue to produce a high value at the input of flip-flop 142 until TEST-REQ goes low.

When TEST-REQ goes low, first synchronizer 118 synchronously causes TEST-GRANT to make a transition from high to low. Once TEST-REQ goes low, AND-gate 136 will cause the input to flip-flop 142 to go low the next time ESYNER-CLK-OUT is in state N−2. Again, first synchronizer 118 makes this transition in response to the signal N−2-STATE. Once ESYNER-CLK-OUT has again reached state N−2, TEST-GRANT makes a transition from high to low upon the next transition from high to low of NXCLK-IN.

Although the illustrated embodiment synchronizes TEST-GRANT and SCAN-GRANT to ESYNER-CLK-OUT when that signal is state N−2, any state of ESYNER-CLK-OUT could be chosen without departing from the scope of the teachings of the present invention. In general, the clock signal for the device under test may be controlled so that it is re-enabled in the state following the state in which it was disabled prior to a scan operation. In other words, if normal operations were suspended when the clock divider was in state X prior to the scan operation, operations should resume with the clock divider in state X+1.

Figure 9:
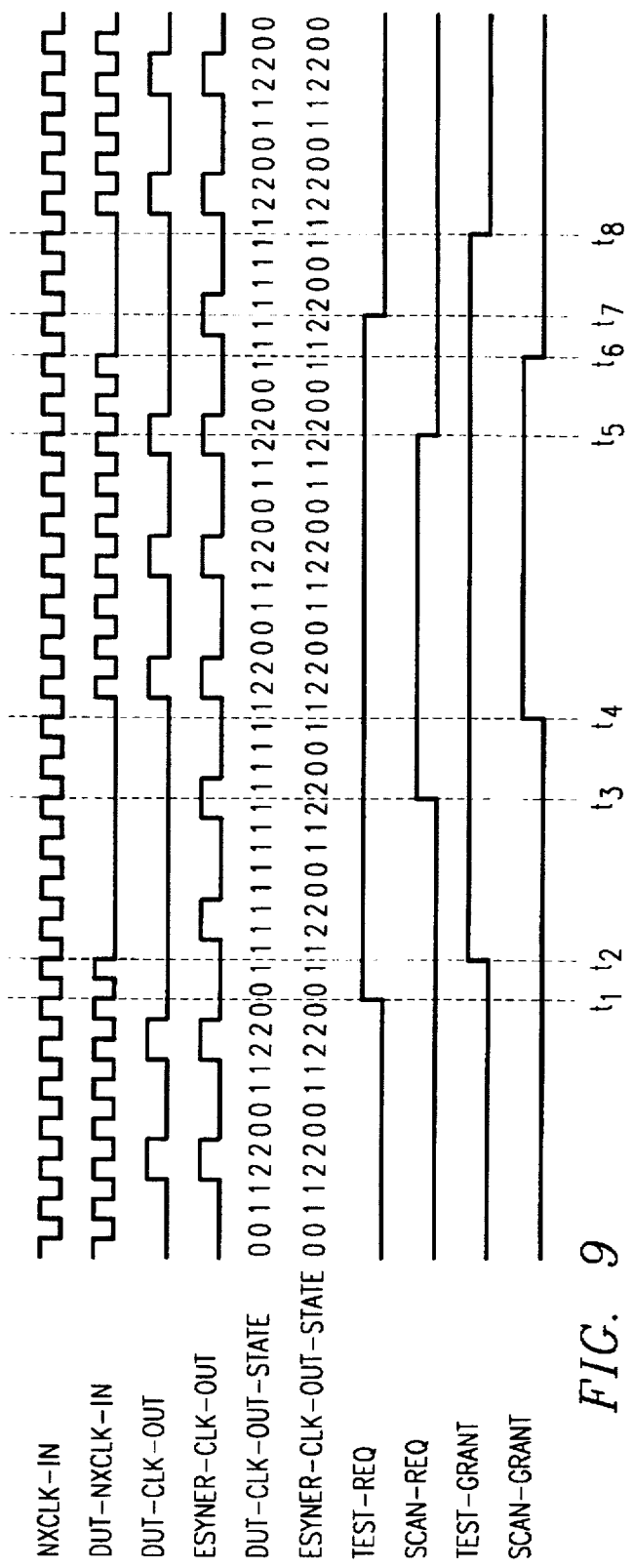
FIG. 9 illustrates waveform and state information demonstrating the operation of the clock synchronizer circuit of FIG. 6.

FIG. 9 illustrates the operation of clock synchronizer 56 for a device under test 52 having a modulo 3 internal clock divider. FIG. 9 illustrates waveforms for the signals NXCLK-IN, DUT-NXCLK-IN, DUT-CLK-OUT, ESYNER-CLK-OUT, TEST-REQ, SCAN-REG, TEST-GRANT, and SCAN-GRANT. FIG. 9 also illustrates state information for DUT-CLK-OUT and ESYNER-CLK-OUT. The waveforms and state information of FIG. 9 result from the operation of the embodiment of clock synchronizer 56 illustrated in FIG. 6. Accordingly, TEST-GRANT and SCAN-GRANT are synchronized to ESYNER-CLK-OUT and make transitions during state N−1. In the present case, because N is 3, TEST-GRANT and SCAN-GRANT make transitions while ESYNER-CLK-OUT is in state 1.

At time $t_1$, clock synchronizer 56 receives a test request signal. Although TEST-REQ and SCAN-REQ signals are coincidentally illustrated as making transitions synchronously with the NXCLK-IN signal, the TEST-REQ and SCAN-REQ signals may occur at any time. At time $t_2$, TEST-GRANT makes a transition from low to high. In accordance with the discussion above, TEST-GRANT makes its transition while ESYNER-CLK-OUT is in state 1 and makes the transition at the falling edge of NXCLK-IN. DUT-NXCLK-IN is disabled in response to TEST-GRANT. At time $t_3$, a scan request is received by clock synchronizer 56. SCAN-GRANT, however, does not make a transition from low to high until time $t_4$ because SCAN-GRANT is synchronized to make transitions at a falling edge of NXCLK-IN and while ESYNER-CLK-OUT is in state 1.

Upon assertion of SCAN-GRANT (transition from low to high in this embodiment), DUT-NXCLK-IN is re-enabled for a scan operation. Consistent with the above discussion DUT-NXCLK-IN is re-enabled in state 2, the state immediately following the state in which it was disabled. After the scanning operation is complete, SCAN-REQ goes low at time $t_5$. SCAN-GRANT, however, does not go low until ESYNER-CLK-OUT is in state 1. Again, the transition of SCAN-GRANT occurs at the falling edge of DUT-NXCLK-IN. DUT-NXCLK-IN is disabled once again upon completion of the scanning operation at time $t_6$. At time $t_7$, TEST-REQ transitions from high to low, indicating the conclusion of a test sequence. TEST-GRANT, however, is not deasserted (does not make a transition from high to low) until time $t_8$. At time $t_8$, ESYNER-CLK-OUT is in state 1 and TEST-GRANT makes its transition upon the falling edge of NXCLK-IN. Following the deassertion of TEST-GRANT (transition from high to low), DUT-NXCLK-IN is re-enabled in state 2, the state following the state in which it was disabled when TEST-GRANT was asserted.

Although the present invention and its advantages have been described in detail, it should be understood that various changes, substitutions and alterations can be made therein without departing from the spirit and scope of the invention as defined by the appended claims.

What is claimed is:

1. A method for generating modular test pattern sets during a functional simulation of a digital circuit, comprising the steps of:

enabling a pattern generator;

executing said functional simulation until a first time mark;

disabling said pattern generator;

capturing the contents of registers in said circuit and storing said contents in a first memory;

re-enabling said pattern generator;

reinitializing said register from said first memory;

performing said functional simulation until a second time mark; and storing a pattern in response to a clock controlling said circuit while said pattern generator is enabled, said pattern representing inputs and outputs of said circuit.

2. The method of claim 1 wherein said stored patterns are test description language patterns.

3. The method of claim 1, further comprising the step of:

continuing said functional simulation between said disabling step and said capturing step until a third time mark.

4. The method of claim 1, further comprising the steps of:

after said disabling step, reading the contents of internal memory in said circuit and storing said contents in a second memory; and after said reloading step, restoring the contents of said internal memory from said second memory.

5. The method of claim 4 wherein said reading and restoring steps are performed using a parallel module test protocol.

6. The method of claim 4, further comprising the step of:

continuing said functional simulation between said disabling step and said reading step, until a third time mark.

7. The method of claim 6 wherein said stored patterns are test description language patterns.

* * * * *